United States Patent
Dickey (10) Patent No.: US 9,391,059 B2
(45) Date of Patent: Jul. 12, 2016

(54) SOLID-STATE POWER CONTROLLER CHANNEL PROTECTION SYSTEMS AND METHODS

(71) Applicant: Hamilton Sundstrand Corporation, Charlotte, NC (US)

(72) Inventor: John A. Dickey, Caledonia, IL (US)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 86 days.

(21) Appl. No.: 14/464,573

(22) Filed: Aug. 20, 2014

(65) Prior Publication Data

US 2016/0056141 A1  Feb. 25, 2016

(51) Int. Cl.
| | |
|---|---|
| *H02H 3/08* | (2006.01) |
| *H01L 27/02* | (2006.01) |
| *G05F 3/08* | (2006.01) |
| *H02M 3/158* | (2006.01) |
| *H02J 1/10* | (2006.01) |
| *H03K 17/082* | (2006.01) |
| *H03K 17/12* | (2006.01) |
| *H03K 17/16* | (2006.01) |
| *H02H 3/20* | (2006.01) |

(52) U.S. Cl.
CPC .............. *H01L 27/0255* (2013.01); *G05F 3/08* (2013.01); *H02H 3/08* (2013.01); *H02H 3/20* (2013.01); *H02J 1/10* (2013.01); *H02M 3/1584* (2013.01); *H03K 17/0822* (2013.01); *H03K 17/122* (2013.01); *H03K 17/167* (2013.01)

(58) Field of Classification Search
CPC ......... H01L 27/0255; H02H 3/08; H02H 3/20
USPC ........................................................ 361/91.5
See application file for complete search history.

(56) References Cited

U.S. PATENT DOCUMENTS

| | | | |
|---|---|---|---|
| 5,324,989 A * | 6/1994 | Thornton | H02H 7/30 307/31 |
| 5,804,859 A | 9/1998 | Takahashi et al. | |
| 6,008,549 A * | 12/1999 | Cooper | H02M 1/088 307/125 |
| 7,379,310 B2 * | 5/2008 | Louvel | H02M 1/32 361/18 |
| 8,847,656 B1 * | 9/2014 | A | H03K 17/08122 327/310 |
| 2006/0250742 A1 | 11/2006 | Fichera | |
| 2008/0106152 A1 * | 5/2008 | Maier | G05F 1/569 307/130 |
| 2008/0239604 A1 * | 10/2008 | Davison | G05F 1/571 361/91.6 |
| 2008/0259914 A1 * | 10/2008 | Simper | H02H 3/087 370/388 |
| 2013/0021701 A1 * | 1/2013 | Yin | H02H 3/20 361/79 |
| 2013/0051100 A1 | 2/2013 | Daigo et al. | |
| 2013/0154717 A1 * | 6/2013 | Tyler | G01R 31/3277 327/432 |

FOREIGN PATENT DOCUMENTS

| | | | |
|---|---|---|---|
| EP | 2388917 A2 * | 11/2011 | ........... H03K 17/122 |
| EP | 2642608 | 9/2013 | |
| WO | 2005015741 | 2/2005 | |

OTHER PUBLICATIONS

Extended European Search Report dated Jan. 14, 2016 in European Application No. 15181721.0.

* cited by examiner

*Primary Examiner* — Scott Bauer
(74) *Attorney, Agent, or Firm* — Snell & Wilmer L.L.P.

(57) ABSTRACT

A scalable solid-state power controller system is provided with channel protection features. A plurality of output channels may be combined to provide a combined channel output. The current provided at the combined channel output is sourced from the plurality of output channels and each channel is protected from faults such as overcurrent events.

15 Claims, 4 Drawing Sheets

SOLID-STATE POWER CONTROLLER CHANNEL PROTECTION SYSTEMS AND METHODS

FIELD

The present disclosure relates to solid-state power controllers and their components, and more particularly, to the interaction of an overload protection system and a solid-state power controller.

BACKGROUND

Solid-state power controllers ("SSPC") have been designed to have a current channel that can be combined with current channels of other SSPCs to achieve a desired current capacity. However, the individual channels may experience different load conditions, for example, in the event that one or more individual channel fails, or in the event that outrush current demands vary or component values vary. Some channels may become overloaded while other channels may remain within operating specifications. In some instances, a so-called "instant trip" monitoring circuit is implemented, however, a fault may occur so rapidly that an interrupt signal from an instant trip monitoring circuit cannot reach the SSPCs in time to direct the SSPCs to trip the circuit offline before one or more channels experience an overload condition. Moreover, in the event, that a load draws a prolonged outrush current, a cascading trip may occur as channels are incrementally overloaded and trip offline.

SUMMARY

A scalable solid-state power controller system is disclosed. The scalable solid-state power controller system includes a power source having a channel bank including a plurality of output channels having a first output channel and a second output channel. The scalable solid-state power controller system includes a first solid-state power controller having a first channel current switching circuit, a second solid-state power controller having a second channel current switching circuit, a controller in electrical communication with the first solid-state power controller and the second solid-state power controller, and a combined channel output. In various embodiments, the first channel current switching circuit is disposed in series between the combined channel output and the first output channel, and the second channel current switching circuit is disposed in series between the combined channel output and the second output channel. In various embodiments, the first channel current switching circuit controls a first current supplied by the first output channel in response to the controller, and the second channel current switching circuit controls a second current supplied by the second output channel in response to the controller.

A method of operating a solid-state power controller is disclosed. The method may include providing, by a controller, a control signal directing a channel current switching circuit to provide a current on a current limiter bus in response to a voltage presented on a gate control bus, and varying, by an output feedback circuit, a reactive impedance limiting the current provided to a combined channel output via the current limiter bus. The method may also include sensing, by the output feedback circuit, the current provided to the combined channel output, providing, by the output feedback circuit, feedback to the channel current switching circuit varying the voltage presented on the gate control bus, and maintaining the current provided to the combined channel output within a desired limit in response to the voltage presented on the gate control bus and in response to the varying the reactive impedance.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

The present disclosure relates to the design of a scalable SSPC system and, more particularly, to the design of a scalable SSPC system comprising a SSPC with self-protection features. Aspects of the designs disclosed herein may be applicable to other power supplies or power sources.

Figure 1:
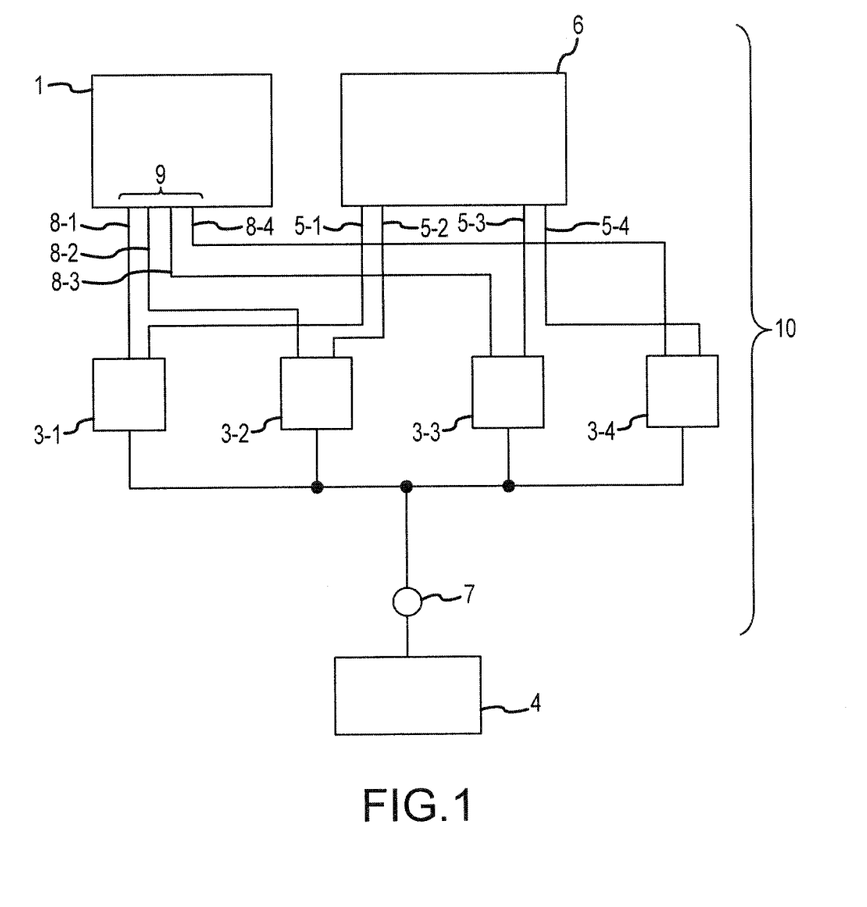
FIG. 1 depict block diagrams of a circuit containing a scalable SSPC system having one or more SSPC in accordance with various embodiments.

According to various embodiments, and with reference to FIG. 1, a scalable SSPC system 10 may comprise a system whereby electrical power is provided for use by a load 4. Moreover, the scalable SSPC system 10 may condition the electrical power so that its current and voltage remains within defined boundaries and may protect itself, and/or the load 4, by preventing the current and voltage from unwanted deviations. For example, the scalable SSPC system 10 may terminate the provision of power, and/or restrict the output current in event of an unexpected drop in load 4's impedance/resistance, such as, during a short-circuit event, or in the event of another fault. For instance, the scalable SSPC system 10 may comprise one or more SSPC 3, whereby the current and or voltage presented at combined channel output 7 may be controlled.

In various embodiments, the scalable SSPC system 10 may comprise a power source 1, a controller 6, a SSPC 3, and a combined channel output 7. The power source 1 may provide electrical power via a channel 8 to one or more SSPC 3, from which it is output at combined channel output 7 in response to a control signal 5 comprising directions from controller 6 to the SSPC 3, and in response to protective actions taken by the SSPC 3 both independently and in response to the control signal 5.

With continuing reference to FIG. 1, a scalable SSPC system 10 may comprise one or more SSPC 3. For example, a scalable SSPC system 10 may comprise a first SSPC 3-1, a second SSPC 3-2, a third SSPC 3-3, a fourth SSPC 3-4 and/or any number of SSPCs 3. Each SSPC may receive electrical power via a channel 8. For example, the first SSPC 3-1 may receive electrical power via a first channel 8-1, the second SSPC 3-2 may receive electrical power via a second channel 8-2, the third SSPC 3-3 may receive electrical power via a third channel 8-3, and the fourth SSPC 3-4 may receive electrical power via a fourth channel 8-4. The electrical power may be combined by the various SSPCs at combined channel output 7. Each SSPC may receive a corresponding control signal 5 from the controller 6. For example, the first SSPC 3-1 may receive a first control signal 5-1, the second SSPC 3-2 may receive a second control signal 5-2, the third SSPC 3-3 may receive a third control signal 5-3, and the fourth SSPC 3-4 may receive a fourth control signal 5-4. By controlling each SSPC, the controller 6 may logically combine SSPCs to increase and/or decrease the current provided at combined channel output 7, as well as control the amount of current drawn from each channel 8.

A power source 1 may comprise any apparatus whereby electrical power may be provided. For example, the power source 1 may be a solid-state power supply. The power source 1 may be a linear power supply, or a switching-mode power supply, or a power supply operating according to a variety of different modes. The power source 1 may further comprise a generator, an alternator, a fuel cell, or another source of electrical energy and in various embodiments may be configured for aircraft use. For example, the power source 1 may comprise a generator mechanically connected with a turbine engine, such as an aircraft engine or an aircraft auxiliary power unit engine. Although, scalable SSPC systems 10 disclosed herein involve power sources 1 that provide direct current, in further embodiments, a power source 1 may provide an alternating current, or may provide any form of electrical power.

In various embodiments, the scalable SSPC system 10 may comprise a controller 6. The controller 6 may comprise a digital controller, an analog controller, or may comprise a combination of digital and analog components. The controller 6 may comprise a logical division of one or more of an aircraft data bus, a remote data concentrator, a flight computer, a full authority digital engine control ("FADEC"), an electronic engine controller ("EEC"), an engine control unit ("ECU"), and/or any other aircraft system. The controller 6 may comprise a processor and a tangible non-transitory memory, as well as a digital-to-analog converter ("DAC"), an analog to digital converter ("ADC"), and/or discrete logic components, for example, TTL and/or CMOS level logic devices. The controller 6 provides a control signal 5 to the SSPC 3 as discussed further herein. For example, the controller 6 may provide a first control signal 5-1 to the first SSPC 3-1 a second control signal 5-2 to the second SSPC 3-2, a third control signal 5-3 to the third SSPC 3-3, a fourth control signal 5-4 to the fourth SSPC 3-4, and/or any number of control signals 5 to any number of SSPCs 3.

The scalable SSPC system 10 may comprise one or more SSPC 3. A SSPC 3 may comprise analog components and/or digital components configured to limit the current and/or voltage output from the power source 1 to the combined channel output 7. For example, the SSPC 3 may sense overcurrent conditions. Moreover, in embodiments comprising a plurality of SSPCs 3, the SSPCs 3 may be directed by the controller 6 to balance the total current provided at the combined channel output 7 among different channels 8 of the power source 1.

Having discussed various aspects of a scalable SSPC system 10, the power source 1 may comprise a channel bank 9. The channel bank 9 may comprise a plurality of output channels. These channels may be combined in parallel. For example, a SSPC may be associated with each channel and the controller may selectively turn different SSPCs on and off in order to logically combine channels together to provide current to the combined channel output 7. In this manner, the total current supplied by the power source 1 may be greater than the power supplied by any one channel. For example, the channel bank 9 may comprise any number of channels. In various embodiments, the channel bank 9 comprises two channels, or three channels, or four channels or any number of channels. In further embodiments, the channel bank 9 comprises only one channel, or comprises various channels combined in various different ways. For the purpose of illustration, a channel bank 9 is illustrated in FIG. 1, comprising four channels: Channel A 8-1, Channel B 8-2, Channel C 8-3, and Channel D 8-4. These channels may be combined in parallel by the SSPCs 3 and the aggregate current may be provided at combined channel output 7. In various embodiments, each channel may have a lesser current capacity than the combined channel output 7. In various embodiments, the SSPCs 3 are configured to maintain each channel within that channel's current capacity and to balance the current drawn among the different channels. In this manner, each channel can be maintained within its limits, even if the combined channel output 7 is of a significantly greater magnitude than an individual channel's limit.

Moreover, while FIG. 1 shows a channel bank 9 having four channels 8-1, 8-2, 8-3, and 8-4, this grouping is for example only and any number of channels 8 and/or channel banks 9 may be combined, depending on the characteristics of the output power desired. For further example, in various embodiments, a channel bank may comprise a single channel, for example, in the event that a single channel can provide the current desired at combined channel output 7.

Figure 2:
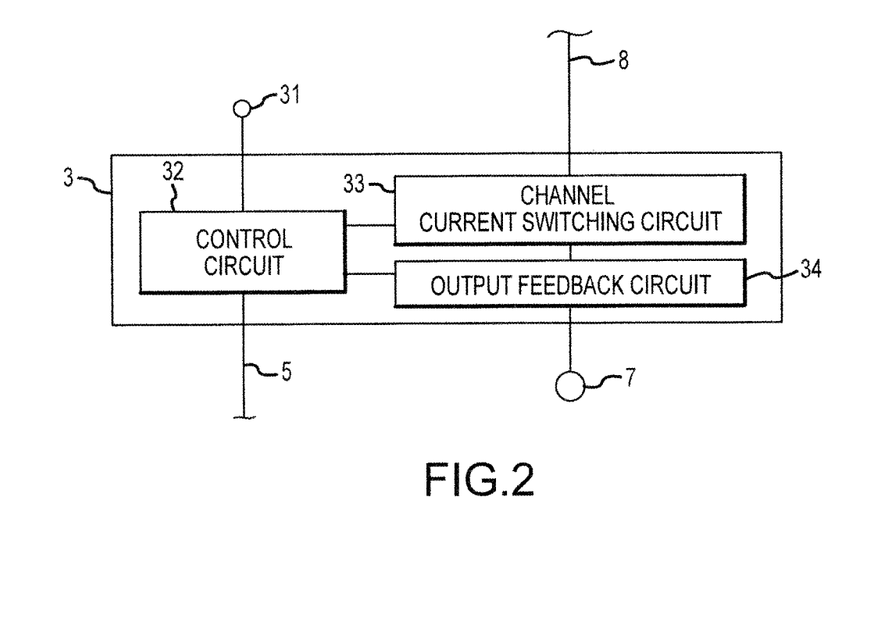
FIG. 2 depicts a block diagram of a SSPC in accordance with various embodiments.

Now, with reference to FIG. 2, a SSPC 3 is presented in greater detail. In various embodiments, a SSPC 3 comprises a channel current switching circuit 33, an output feedback circuit 34, and a control circuit 32. These various components are connected in electrical communication.

A channel current switching circuit 33 is connected to a channel 8. For example, Channel A 8-1, Channel B 8-2, Channel C 8-3, and Channel D 8-4 each are connected to the channel current switching circuit 33 of a separate first SSPC 3-1, second SSPC 3-2, third SSPC 3-3, and fourth SSPC 3-4. The channel current switching circuit 33 regulates the current flowing from the connected channel, in response to the control circuit 32 and the output feedback circuit 34. The current then passes through the output feedback circuit 34 and out via the combined channel output 7 to a load 4 (see FIG. 1).

An output feedback circuit 34 is connected to the channel current switching circuit 33 and the control circuit 32. The output feedback circuit 34 monitors the current passing out of the SSPC 3 to the combined channel output 7 and provides a signal to the control circuit 32 in response to the current passing out of the SSPC 3. For example, the output feedback circuit 34 may provide a signal indicating that the control circuit 32 should direct the channel current switching circuit 33 to reduce and/or limit the current provided to the combined channel output 7 from the SSPC 3 in response to the output feedback circuit 34 detecting that the current is too high and/or is approaching a desired limit. The output feedback circuit 34 may provide a signal to the control circuit 32 indicating that the channel current switching circuit 33 should increase the path resistance between the channel 8 and the combined channel output 7 in order to prevent the combined current from all SSPCs 3, and/or the individual current from a single SSPC 3 from becoming too high, or reduce the path resistance to prevent the combined current from all SSPCs 3, and/or the individual current from a single SSPC 3 from becoming too low. Moreover, the output feedback circuit 34 may contain reactive passive components, for example, to immediately respond to various circuit conditions, for example, inductive components whereby the deleterious effects of an excessive outrush current may immediately be compensated.

A control circuit 32 may receive a control signal 5 from a controller 6 and may receive a voltage reference 31. In various embodiments, the voltage reference 31 may correspond to the nominal voltage presented at the channel 8, although it may be any desired value. The control circuit 32 may adjust the current drawn from the channel 8 in response to the control signal 5 and the voltage reference 31.

Figure 3:
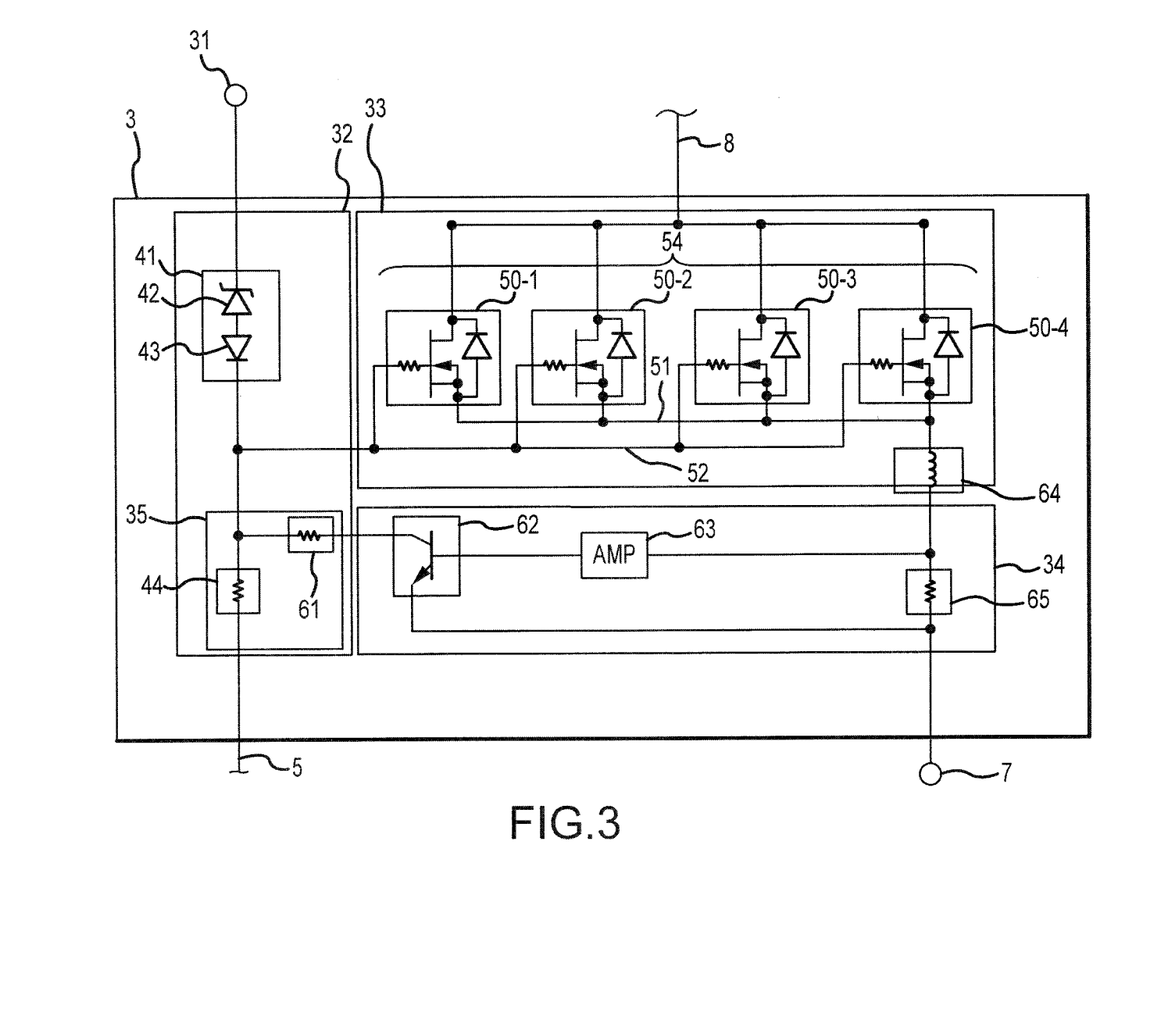
FIG. 3 depicts a detailed view of a SSPC in accordance with various embodiments.

Now, with reference to FIG. 3, a detailed schematic diagram of an example SSPC 3 is provided. As previously discussed, a SSPC 3 may comprise a channel current switching circuit 33, an output feedback circuit 34, and a control circuit 32.

A channel current switching circuit 33 may comprise a circuit arranged to limit the current provided by the channel 8. For instance, the channel current switching circuit 33 may comprise a current limiter bank 54. The current limiter bank 54 may comprise a plurality of current limiters corresponding in number to the maximum amount of current that the connected channel 8 can provide divided by the current handling capacity of each current limiter. For example, the current limiter bank 54 may comprise a first current limiter 50-1, a second current limiter 50-2, a third current limiter 50-3, and a fourth current limiter 50-4, all connected in parallel. Moreover, the channel current switching circuit 33 may optionally include an inductive damper 64.

Each current limiter may comprise a transistor. The control circuit 32 and the output feedback circuit 34 may control the current limiters. In addition, the transistor may comprise a field-effect transistor. Thus, in various embodiments, the control circuit 32 and the output feedback circuit 34 may control the current limiters by controlling the gate of each transistor. In this manner, a selectably conductive path may be controlled corresponding to each channel of the channel bank 9. In various embodiments, the gate voltage of the transistor may be changed by the control circuit 32 and the output feedback circuit 34. Furthermore, in various embodiments, the transistor gate voltage of each current limiter may be changed by the control circuit 32 and the output feedback circuit 34 in unison, for instance, the gates may all be connected to a gate control bus 52. In this manner, the resistivity of the source-drain conduction path of the transistors may be varied, thus variously limiting the amount of current flowing through the transistors. One end of each source-drain conduction path of a transistor may be connected in parallel to a channel 8, while the other end may be connected in parallel to a current limiter bus 51. Thus, the transistors provide overcurrent protection to the channel 8, as well as cooperating with the transistors of the channel current switching circuits 33 of other SSPCs to actively balancing the current drawn by a load among all channels 8 of the channel bank 9, as directed by the controller 6 and/or the channel current switching circuit's respective corresponding output feedback circuit 34.

The transistors may be operated in the linear region (also known as the ohmic or Triode mode). In this manner, the resistivity of the source-drain conduction path may be varied; however, under some circuit conditions, one or more transistors may be operated in the active region, such as when maximum current is desired to be supplied. Each transistor may be a p-channel FET, or an n-channel FET. Alternatively, other transistors such as bipolar junction transistors ("BJTs"), whether NPN or PNP, may be implemented, or other voltage-controlled switches or other current-controlled switches may be implemented. In various embodiments, the current limiter further comprises a protection resistor connected in series with the gate of each transistor.

The current limiter bus 51 may comprise a bus connecting the current output of each current limiter of the current limiter bank 54. These outputs may be combined, and connected to the combined channel output 7, for example, via a path through the output feedback circuit 34.

Similarly, the gate control bus 52 may comprise a bus connecting the gates of the transistors of the current limiter bank 54 together. These gates may be connected together so that the gate voltage may be changed in unison across all current limiters of current limiter bank 54 (by the control circuit 32 and the output feedback circuit 34). As a result, the current provided by the combined channel output 7 may be balanced across all the channels 8 of the channel bank 9, via individualized control of each SSPC's gate control bus 52 via control signals 5.

An inductive damper 64 may be disposed in series with the current limiter bus 51 and the combined channel output 7. The inductive damper 64 may comprise an inductor or any other component configured to dampen changes in current over time. In this manner, large startup currents may be dampened, protecting the load, and fluctuations/noise caused by the load, such as switching noise, may be dampened, protecting the scalable SSPC system 10.

An output feedback circuit 34 may comprise a circuit arranged to monitor the combined current provided at the combined channel output 7 and provide feedback to the channel current switching circuit 33 instructing the channel current switching circuit 33 to increase or decrease the current provided. For example, the output feedback circuit 34 may comprise a feedback amplifier 62, and a sense resistor 65. In various embodiments, the output feedback circuit 34 may optionally include a signal amplifier 63.

A feedback amplifier 62 may comprise a current controlled amplifier. For example, the feedback amplifier 62 may comprise a bipolar junction transistor. Moreover, the sense resistor 65 may comprise a resistor disposed between the channel current switching circuit 33 and the combined channel output 7. As current flows through the sense resistor 65, a voltage is developed across the sense resistor 65. The base of the bipolar junction transistor and the emitter of the bipolar junction transistor may be connected to opposite sides of the sense resistor 65. In this manner, the voltage developed across the sense resistor 65 controls the resistivity of the bipolar junction transistor collector-emitter pathway. The collector may be connected to a control circuit 32 (for example, the control circuit/feedback circuit balancer 35 discussed further herein), which may then connect to the gate control bus 52. In this manner, the voltage present on the gate control bus 52 may be controlled in response to the current flowing through the sense resistor 65 so that a feedback loop is established wherein the feedback amplifier 62 controls the gate control bus voltage in response to the current output of the SSPC (which is then combined with that of any other SSPCs and provided to combined channel output 7). Thus, the gate control bus 52 voltage may change in response to the output current to cause the channel current switching circuit 33 to limit the output current and bring it into compliance with the desired current limit, such as in the event of a fault condition. Some fault conditions may include a short circuit or startup load variations, such as outrush current during a transient event.

A signal amplifier 63 may be disposed between the sense resistor 65 and the base of the bipolar junction transistor comprising the feedback amplifier 62. The signal amplifier 63 may increase and/or decrease the sensitivity of the output feedback circuit 34, or may otherwise condition the behavior of the output feedback circuit 34 as desired for a particular application. In various embodiments, the amplifier comprises a solid-state operational amplifier, though any amplifier configuration may be implemented. In further embodiments, the signal amplifier 63 is omitted.

With ongoing reference to FIG. 3, a control circuit 32 may be incorporated as well. The control circuit 32 may include a overvoltage protector 41 and a control circuit/feedback circuit balancer 35. The overvoltage protector 41 may be in electrical communication with a voltage reference 31. The overvoltage protector 41 may comprise a circuit to condition the voltage reference 31 and provide power to the gate control bus 52 during certain scenarios, such as a transient overvoltage condition, to force current limiters 50 to an on condition until the scenario, such as a transient overvoltage condition, has passed. Thus the overvoltage protector 41 may provide overvoltage protection, such as lightning protection. In various embodiments, the overvoltage protector 41 comprises a Zener diode 42 and a power diode 43. The Zener diode 42 may be arranged in a reverse biased configuration in order to regulate the voltage supplied by the overvoltage protector 41 while the power diode 43 may be arranged in a forward biased configuration in order to provide reverse current protection to voltage reference 31 and enable proper functioning of control circuit/feedback circuit balancer 35.

The control circuit 32 may selectively sink the gate control bus 52 to ground, thus selectively changing the voltage on the gate control bus 52. Thus, the control circuit 32 may comprise a control circuit/feedback circuit balancer 35 comprising a voltage divider to join different signals on the gate control bus 52. For instance, the control signal 5 may be connected to the control circuit 32. A control resistor 44 may be disposed in the circuit path. Similarly, the channel current switching circuit 33 may be connected to the control circuit 32 and a feedback resistor 61 may be disposed in the circuit path between the collector of the feedback amplifier 62 and the overvoltage protector 41. The channel current switching circuit 33 and the control signal 5 may selectively change the voltage on the gate control bus 52. For example, during normal operation, control signal 5 may control the voltage present on gate control bus 52, however, during an overcurrent condition, the output feedback circuit 34 may lower the voltage on the gate control bus 52 and during an overcurrent condition, overvoltage protector 41 may increase the voltage on the gate control bus 52. Thus, one may appreciate that a parallel voltage divider may be established by the feedback resistor 61 and the control resistor 44 which are connected in parallel (and are in series with the overvoltage protector 41). The gate control bus 52 may also be connected in parallel with the feedback resistor 61 and the control resistor 44. Thus, the voltage presented on the gate control bus 52 may be varied in response to the control signal 5, which may comprise a resistivity of the path through the controller 6, and in response to the resistivity of the collector-emitter path through the bipolar junction transistor comprising the feedback amplifier 62. In this manner, the controller 6 may control the current supplied by the SSPC to the combined channel output 7 through the channel 8, and the output feedback circuit 34 may also control the current supplied at the combined channel output 7 through the channel 8.

The feedback resistor 61 and control resistor 44 may be selected to enable a prioritization of the different control functions connected to gate control bus 52. For example, if overvoltage protector 41 conducts due to an overvoltage, overvoltage protector 41 has the highest priority because, among other reasons, there is no resistor between overvoltage protector 41 and the gate control bus 52. If there is no overvoltage, but there is an overcurrent, feedback resistor 61 facilitates a controlled reduction in the voltage on gate control bus 52. If both an overvoltage and overcurrent condition occur at the same time, then overvoltage protector 41 may override feedback resistor 61 and control resistor 44 because it provides a direct path without a resistor—thus, the current limiters 50 may be forced on, even though an overcurrent condition exists, in order to address the overvoltage condition as a higher priority condition. Similarly, during normal operation, feedback resistor 61 may provide no control function and instead the control signal 5 via control resistor 44 may control the voltage on gate control bus 52.

Figure 4:
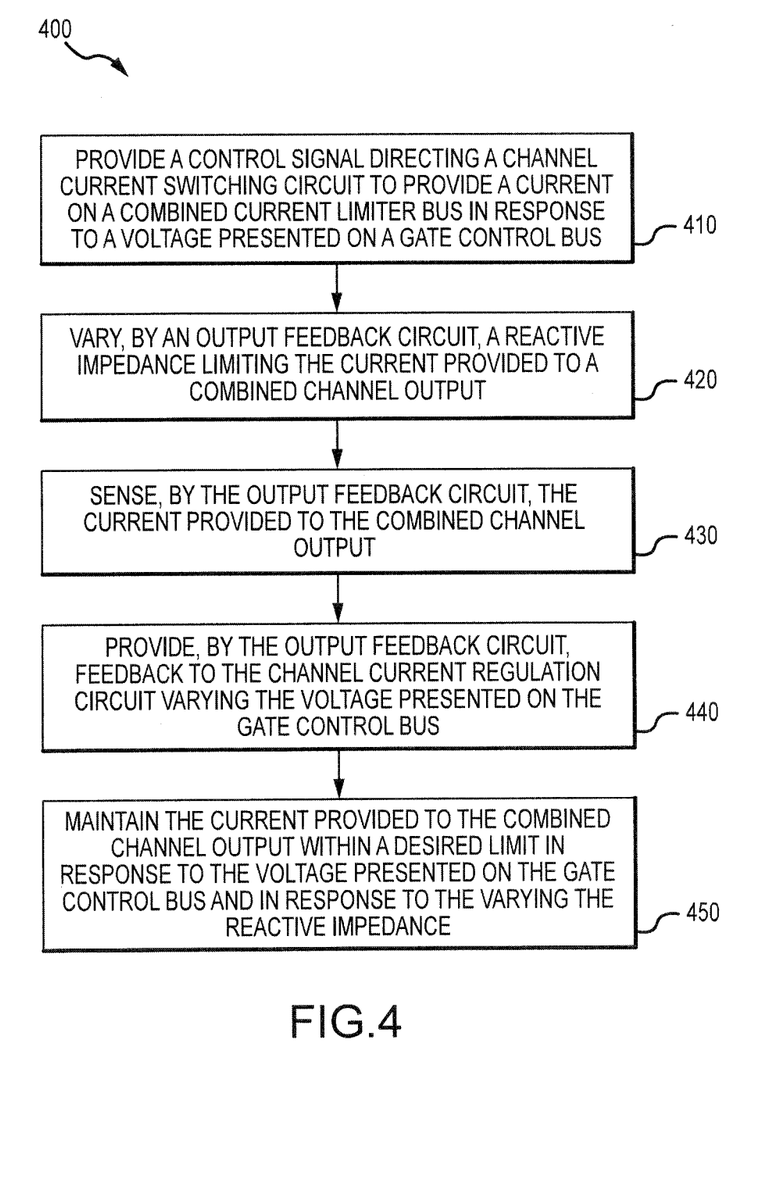
FIG. 4 depicts a method whereby a scalable SSPC system may be operated in accordance with various embodiments.

Having discussed various aspects of a scalable SSPC system 10 and an SSPC 3, a SSPC 3 may be operated according to various methods. For example, with reference to FIGS. 1, 3, and 4, a method 400 is provided wherein the controller 6 may provide a control signal 5 directing a channel current switching circuit 33 to provide a current on a current limiter bus 51 in response to a voltage presented on a gate control bus 52 (Step 410). In various embodiments, the load 4 may be a reactive load, so that a large outrush current is demanded at initial startup. Thus, the output feedback circuit 34 may vary a reactive impedance limiting the current provided to a combined channel output 7 (Step 420). Furthermore, the SSPC 3 may sense, by the output feedback circuit 34, the current provided to the combined channel output 7 (Step 430). The output feedback circuit 34 may provide feedback to the channel current switching circuit 33 varying the voltage presented on the gate control bus 52 (Step 440). In this manner, the current provided to the combined channel output 7 may be maintained within a desired limit in response to the voltage presented on the gate control bus 52 and in response to the varying the reactive impedance (Step 450). Thus, the SSPC 3 may provide active current regulation, such as in response to transient events, for example, a load fault, such as outrush currents short circuits, and/or overload conditions.

While the systems described herein have been described in the context of scalable SSPC systems for implementation in aircraft applications; however, one will appreciate in light of the present disclosure, that the systems described herein may be used in various other applications, for example, different vehicles, different power applications, and different circuit protection arrangements, or any other vehicle or device, or in connection with industrial processes, or propulsion systems, or any other system or process having need for a power supply with channel protection.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A scalable solid-state power controller system comprising:
   a power source comprising a channel bank comprising a plurality of output channels comprising a first output channel and a second output channel;
   a first solid-state power controller comprising:
      a first channel current switching circuit;
      an output feedback circuit; and
      a control circuit comprising an overvoltage protector and a control circuit/feedback circuit balancer, wherein the control circuit/feedback circuit balancer comprises a feedback resistor connected in parallel with a control resistor, the feedback resistor and the control resistor being connected in series with the overvoltage protector:
   a second solid-state power controller comprising a second channel current switching circuit;
   a controller in electrical communication with the first solid-state power controller via the control resistor and the second solid-state power controller; and
   a combined channel output,
   wherein the first channel current switching circuit is disposed in series between the combined channel output and the first output channel,
   wherein the second channel current switching circuit is disposed in series between the combined channel output and the second output channel,
   wherein the first channel current switching circuit controls a first current supplied by e first output channel in response to the controller, and
   wherein the second channel current switching circuit controls a second current supplied by the second output channel in response to the controller.

2. The scalable solid-state power controller system according to claim 1, wherein each of the plurality of output channels have different current capacities.

3. The scalable solid-state power controller system according to claim 1, wherein a current capacity of the combined channel output is greater than a current capacity of at least one of the plurality of output channels.

4. The scalable solid-state power controller system according to claim 1, wherein the first channel current switching circuit comprises:
   a channel current limiter bank comprising a plurality of variable conduction paths;
   a current limiter bus comprising a single conduction path, in electrical communication with each variable conduction path of the channel current limiter bank; and
   a gate control bus whereby the plurality of variable conduction paths are controlled.

5. The scalable solid-state power controller system according to claim 4, wherein each of the variable conduction path comprises a field-effect transistor.

6. The scalable solid-state power controller system according to claim 5, wherein
   the gate control bus is controlled by the output feedback circuit and the control circuit
   wherein the control circuit is in electrical communication with the controller and the gate control bus, and
   wherein the output feedback circuit is in electrical communication with the combined channel output and the gate control bus.

7. The scalable solid-state power controller system according to claim 6, wherein the output feedback circuit of the first solid-state power controller comprises:
   a sense resistor in series with the combined channel output;
   a bipolar junction transistor comprising a base, a collector, and an emitter, wherein the sense resistor is in electrical communication with the base and the emitter, and wherein the collector is in electrical communication with the control circuit.

8. The scalable solid-state power controller system according to claim 7, wherein the output feedback circuit of the first solid-state power controller comprises an amplifier disposed between the sense resistor and the base.

9. The scalable solid-state power controller system according to claim 7, wherein the first solid-state power controller further comprises a channel current switching circuit comprising an inductive damper at least one of: disposed between the current limiter bus of the combined channel output and the sense resistor of the output feedback circuit, and between the sense resistor f the output feedback circuit and the combined channel output.

10. The scalable solid-state power controller system according to claim 9, wherein the first solid-state power controller further comprises a reactive load connected in electrical communication with the combined channel output.

11. The scalable solid-state power controller system according to claim 7, wherein the control circuit/feedback circuit balancer is in electrical communication with the controller, the output feedback circuit, and the gate control bus, whereby the gate control bus is controlled in response to the controller and the output feedback circuit.

12. The scalable solid-state power controller system according to claim 11, wherein the
   control resistor is in series with the controller and the gate control bus; and
   the feedback resistor is in series with the collector of the bipolar junction transistor of the output feedback circuit and the gate control bus.

13. The scalable solid-state power controller system according to claim 12, wherein the overvoltage protector is in series with a voltage reference and the gate control bus.

14. The scalable solid-state power controller system according to claim 13, wherein the overvoltage protector of the first solid-state power controller comprises:
   a Zener diode in reverse-biased series with the voltage reference; and
   a power diode in forward-biased series between the Zener diode and the gate control bus.

15. A method of operating a solid-state power controller comprising:
   providing, by a control signal directing a channel current switching circuit to provide a current on a current limiter bus in response to a voltage presented on a gate control bus;
   providing by the controller, a voltage reference to the channel current switching circuit via an overvoltage protector and to a circuit balancer via the overvoltage protector, the voltage reference corresponding to a nominal voltage presented at a channel,
   varying, by an output feedback circuit, a reactive impedance limiting the current provided to a combined channel output via the current limiter bus;
   sensing, by the output feedback circuit, the current provided to the combined channel output;
   providing, by the output feedback circuit, feedback to the channel current switching circuit varying the voltage presented on the gate control bus; and
   maintaining the current provided to the combined channel output within a desired limit in response to the voltage presented on the gate control bus and in response to the varying the reactive impedance.

\* \* \* \* \*